(12) United States Patent
Sato et al.

(10) Patent No.: US 7,005,693 B2
(45) Date of Patent: Feb. 28, 2006

(54) SEMICONDUCTOR MEMORY DEVICE FOR STORING DATA IN MEMORY CELLS AS COMPLEMENTARY INFORMATION

(75) Inventors: Ayako Sato, Kawasaki (JP); Masato Matsumiya, Kawasaki (JP); Satoshi Eto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 99 days.

(21) Appl. No.: 10/653,194

(22) Filed: Sep. 3, 2003

(65) Prior Publication Data

US 2004/0061144 A1    Apr. 1, 2004

(30) Foreign Application Priority Data

Sep. 30, 2002    (JP)    ............................. 2002-285061

(51) Int. Cl.
 *H01L 27/108*    (2006.01)

(52) U.S. Cl. ...................... 257/296; 257/401; 257/202; 257/208; 365/230.04; 365/230.06

(58) Field of Classification Search ................ 257/296, 257/338, 369, 401, 202, 207, 208; 365/149, 365/51, 63, 230.04, 230.06
See application file for complete search history.

(56) References Cited

U.S. PATENT DOCUMENTS 6,597,599 B1 *    7/2003    Morihara et al. ............ 365/149

FOREIGN PATENT DOCUMENTS

JP    2001-143463    5/2001

* cited by examiner

*Primary Examiner*—Minhloan Tran
*Assistant Examiner*—Tan Tran
(74) *Attorney, Agent, or Firm*—Arent Fox PLLC (57) ABSTRACT

A twin-cell type semiconductor memory device in which the area of a chip can be reduced. In the twin-cell type semiconductor memory device for storing data in at least one pair of memory cells as complementary information, memory cells are arranged at each of a plurality of word lines at intervals at which bit lines are located. At least the one pair of memory cells, which have stored the complementary information and which indicate a plurality of areas each connected to a pair of bit lines, form a twin cell.

10 Claims, 11 Drawing Sheets

SEMICONDUCTOR MEMORY DEVICE FOR STORING DATA IN MEMORY CELLS AS COMPLEMENTARY INFORMATION

CROSS-REFERENCE TO RELATED APPLICATIONS

This application is based upon and claims the benefits of priority from the prior Japanese Patent Application No. 2002-285061, filed on Sep. 30, 2002, the entire contents of which are incorporated herein by reference.

BACKGROUND OF THE INVENTION (1) Field of the Invention

This invention relates to a semiconductor memory device and, more particularly, to a twin-cell type semiconductor memory device for storing data in a pair of memory cells as complementary information.

(2) Description of the Related Art

With the improvement of the performance of electronic devices, such as portable devices, highly reliable memories in which low power consumption, large capacity, and a high integration level can be realized have been needed in recent years.

A memory cell in semiconductor memory devices of a dynamic random access memory (DRAM) type has a simple structure. That is to say, it includes one cell transistor and one capacitor. Therefore, with semiconductor memory devices of a DRAM type a high integration level and large capacity can be realized easily. As a result, it is hoped that semiconductor memory devices of a DRAM type will be applied more widely and that their performance will be improved further.

In addition, twin-cell type DRAMs in which data is stored in a pair of memory cells as complementary information corresponding to the high level (H level) and the low level (L level) have been suggested to, for example, reduce power consumed in DRAMs (refer to, for example, Japanese Unexamined Patent Publication No. 2001-143463 (the paragraph numbers [0026]–[0032] and FIG. 1)).

Figure 8A:
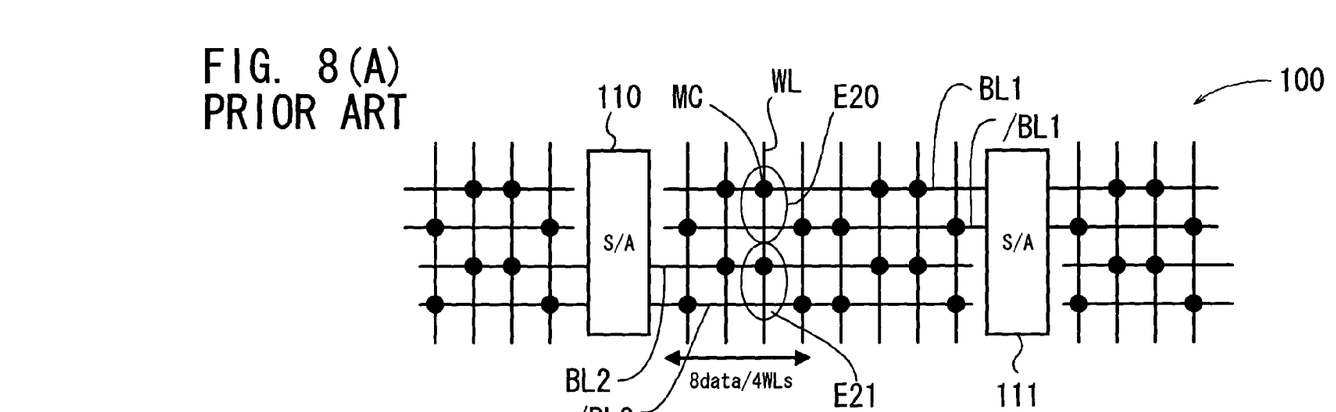
FIGS. 8(A) and 8(B) are simplified views showing the arrangement of memory cells in a conventional semiconductor memory device of a DRAM type, FIG. 8(A) being a simplified view showing the arrangement of memory cells in a single-cell semiconductor memory device of a DRAM type, FIG. 8(B) being a simplified view showing the arrangement of memory cells in a twin-cell semiconductor memory device of a DRAM type.
Figure 8B:
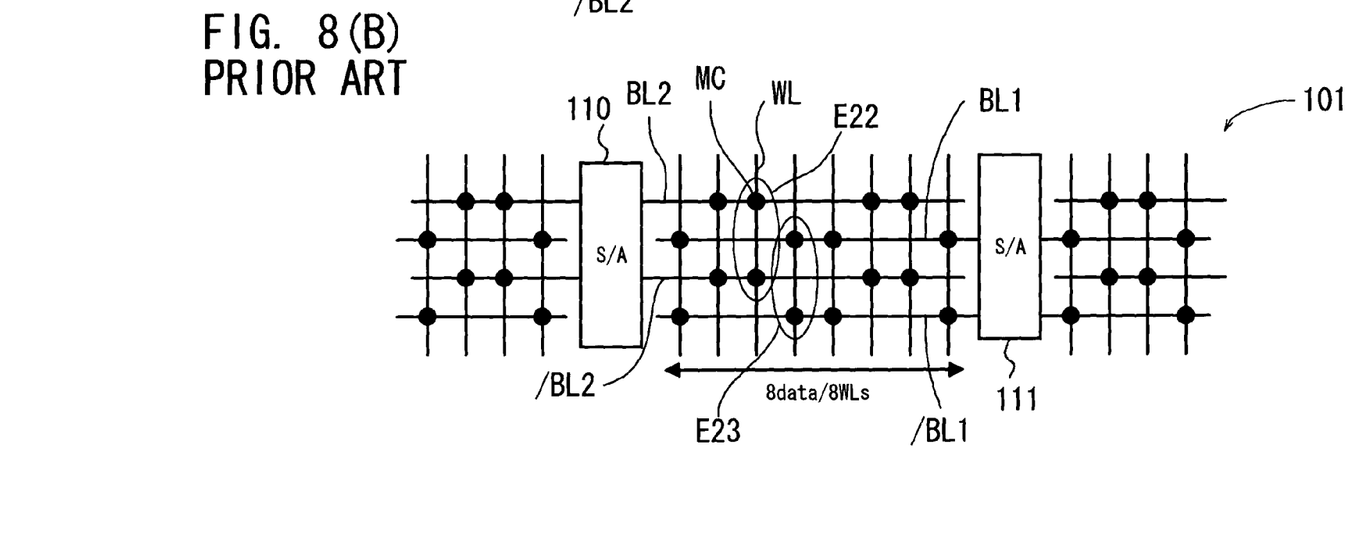

FIGS. 8(A) and 8(B) are simplified views showing the arrangement of memory cells in a conventional semiconductor memory device of a DRAM type. FIG. 8(A) is a simplified view showing the arrangement of memory cells in a single-cell semiconductor memory device of a DRAM type. FIG. 8(B) is a simplified view showing the arrangement of memory cells in a twin-cell semiconductor memory device of a DRAM type.

Both in a single-cell type semiconductor memory device 100 and in a twin-cell type semiconductor memory device 101, memory cells MC each including one cell transistor and one cell capacitor (1T/1C structure) are located at positions where bit lines BL1, /BL1, BL2, and /BL2 and a word line WL intersect alternately. The same cell array is used in the semiconductor memory devices 100 and 101, so cells are arranged in the same way. The semiconductor memory devices 100 and 101 differ in how to connect the bit lines BL1, /BL1, BL2, and /BL2 and sense amplifiers 110 and 111. In the single-cell type semiconductor memory device 100 shown in FIG. 8(A), the bit lines BL1 and /BL1 pair and are connected to the sense amplifier 111. Similarly, the bit lines BL2 and /BL2 pair and are connected to the sense amplifier 110. On the other hand, in the twin-cell type semiconductor memory device 101 shown in FIG. 8(B), the bit lines BL2, BL1, /BL2, and /BL1 are located in that order from the top. The bit lines BL1 and /BL1 pair and are connected to the sense amplifier 110. The bit lines BL2 and /BL2 pair and are connected to the sense amplifier 111.

Information held in each of areas E20, E21, E22, and E23 shown in FIGS. 8(A) and 8(B) will be treated as a piece of data when one word line WL is driven. That is to say, in the area E20 shown in FIG. 8(A), the potential of the bit line BL1 to which a memory cell MC is connected and the potential of the bit line /BL1 (which holds reference potential) to which a memory cell MC is not connected are compared by the sense amplifier 111 and 1-bit data is read. Similarly, in the area E21, the potential of the bit lines BL2 and /BL2 are compared by the sense amplifier 110 and 1-bit data is read. In the area E22 shown in FIG. 8(B), the potential of the complementary bit lines BL2 and /BL2 connected to the gates of a pair of memory cells MC where complementary information has been stored are compared by the sense amplifier 110 and 1-bit data is read. Similarly, in the area E23, the potential of the complementary bit lines BL1 and /BL1 are compared by the sense amplifier 111 and 1-bit data is read.

In the twin-cell type semiconductor memory device 101 shown in FIG. 8(B), only the sense amplifier 110 is activated to read data from the area E22. In this case, there is no need to activate the sense amplifier 111. On the other hand, only the sense amplifier 111 is activated to read data from the area E23. There is no need to activate the sense amplifier 110. Moreover, in the case of reading, complementary information stored in a pair of memory cells MC and corresponding to the H and L levels is read by the complementary bit lines BL1 and /BL1 or the complementary bit lines BL2 and /BL2. This will give a large margin for holding data, compared with the single-cell type semiconductor memory device 100 in which a comparison is made between the potential of a bit line and reference potential. As a result, a refresh cycle can be lengthened and power consumption can be reduced.

There are two kinds of layouts of a cell array in the semiconductor memory devices 100 and 101 shown in FIG. 8: capacitor under bitline (CUB) structure in which cell capacitors are formed under bit lines and capacitor over bitline (COB) structure in which cell capacitors are formed over bit lines.

With the CUB structure, the process for forming cell capacitors comes before the process for forming bit lines. On the other hand, with the COB structure, the process for forming bit lines comes before the process for forming cell capacitors.

Figure 9A:
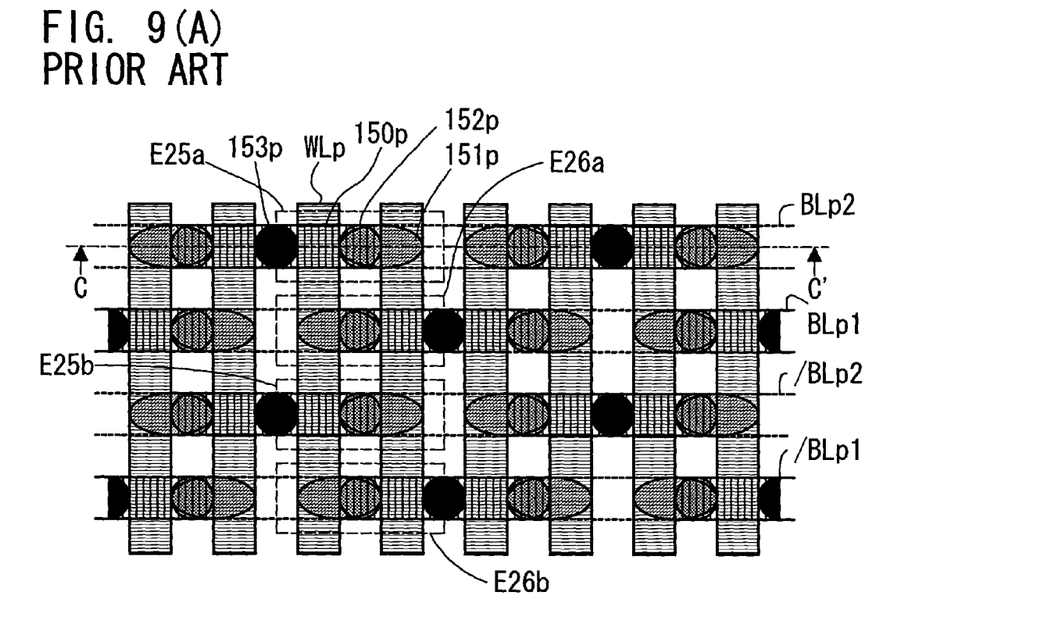
FIGS. 9(A) and 9(B) are a view showing a pattern of the layout of a cell array in a conventional semiconductor memory device having the CUB structure and a schematic cross sectional view of the semiconductor memory device, FIG. 9(A) being a view showing a pattern of the layout of a cell array in a semiconductor memory device having the CUB structure, FIG. 9(B) being a fragmentary cross sectional view taken along the line C–C' of FIG. 9(A).
Figure 9B:
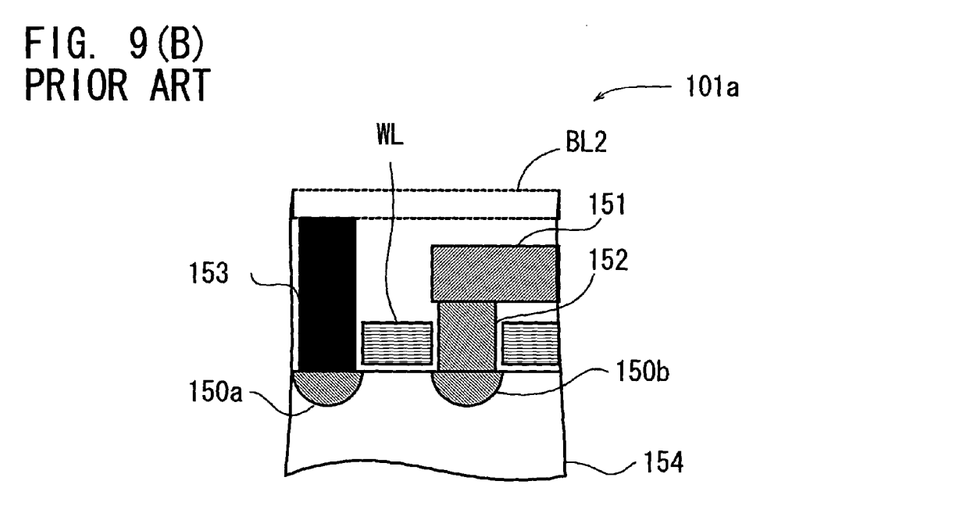

FIGS. 9(A) and 9(B) are a view showing a pattern of the layout of a cell array in a conventional semiconductor memory device having the CUB structure and a schematic sectional view of the semiconductor memory device. FIG. 9(A) is a view showing a pattern of the layout of a cell array in a semiconductor memory device having the CUB structure. FIG. 9(B) is a fragmentary cross sectional view taken along the line C–C' of FIG. 9(A).

The layout pattern shown in FIG. 9(A) can be applied both to the single-cell type semiconductor memory device 100 shown in FIG. 8(A) and to the twin-cell type semiconductor memory device 101 shown in FIG. 8(B), but descriptions of a twin-cell type semiconductor memory device will now be given.

On a layout pattern for a semiconductor memory device 101a having the CUB structure, bit line patterns BLp1, /BLp1, BLp2, and /BLp2 indicated by dotted lines and a plurality of word line patterns WLp are located like a grid and substrate diffusion layer patterns 150p located in the same direction as the bit line patterns BLp1, /BLp1, BLp2, and /BLp2, capacitor patterns 151p, and contact plug patterns 152p and 153p are arranged as areas corresponding to memory cells MC shown in FIG. 8. As shown in FIG. 9(B), the semiconductor memory device 101a fabricated by the use of this layout pattern includes diffusion layers 150a and 150b formed in a substrate 154, capacitors 151 formed under bit lines BL1, /BL1, BL2, and /BL2, contact plugs 152 for connecting a diffusion layer 150b and a capacitor 151, and contact plugs 153 for connecting a diffusion layer 150a and the bit line BL1, /BL1, BL2, or /BL2. Because of restrictions regarding fabrication, each capacitor 151 will be formed at a certain distance (corresponding to the width of one word line, in this example) from a contact plug 153 for connecting a diffusion layer 150a and from the next capacitor 151. Each of areas E25a, E25b, E26a, and E26b in FIG. 9(A) enclosed with a dashed line corresponds to one memory cell MC having the 1T/1C structure. The areas E25a and E25b pair and form a twin cell. Similarly, the areas E26a, and E26b pair and form a twin cell.

It is assumed that the substrate 154 is a p-type one and that the diffusion layers 150a and 150b which will function as a drain or a source are n-type ones. Then, for example, an oxide film (not shown) will be formed beneath word lines WL with these word lines WL as gate electrodes. As a result, n-channel metal oxide semiconductor field effect transistors (MOSFETs) will be formed.

In the above example, stack capacitors have been used to form CUB structure. However, trench capacitors may be used instead. Descriptions of a case where trench capacitors are used will be omitted.

Figure 10A:
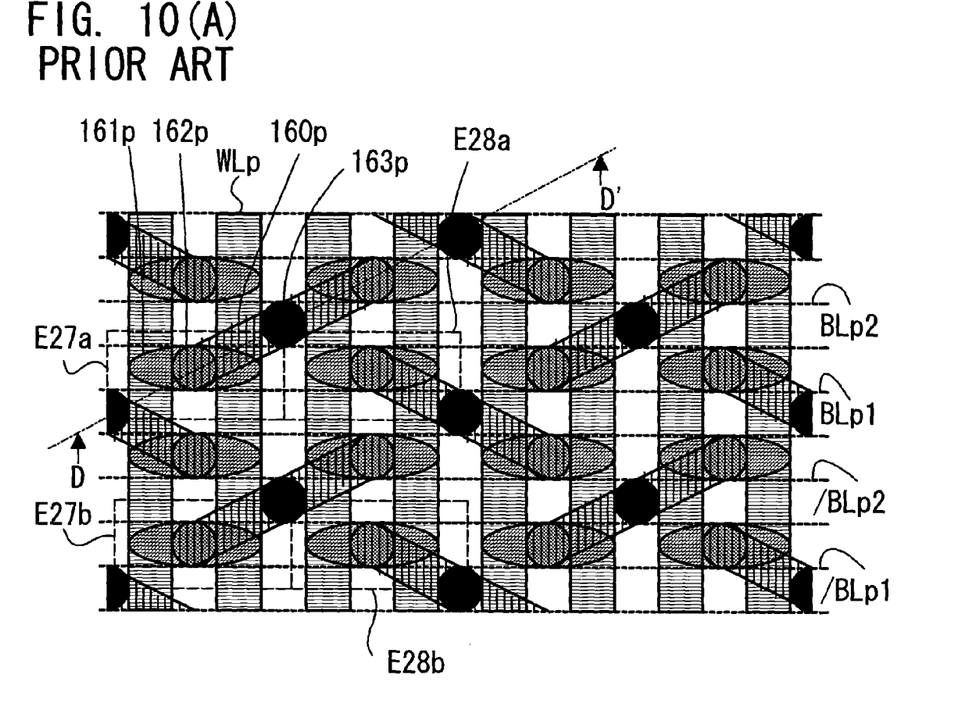
FIGS. 10(A) and 10(B) are a view showing a pattern of the layout of a cell array in a conventional semiconductor memory device having the COB structure and a schematic cross sectional view of the semiconductor memory device, FIG. 10(A) being a view showing a pattern of the layout of a cell array in a semiconductor memory device having the COB structure, FIG. 10(B) being a fragmentary cross sectional view taken along the line D–D' of FIG. 10(A).
Figure 10B:
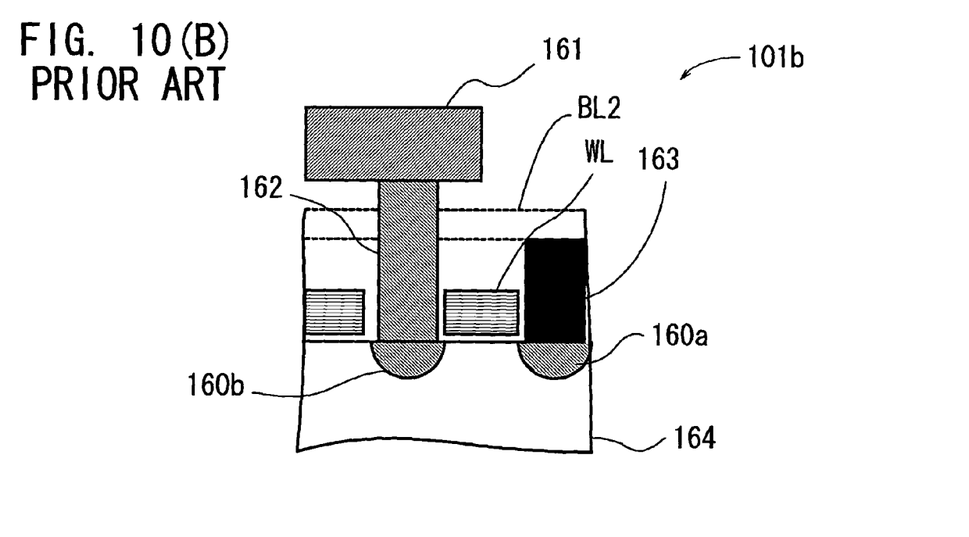

FIGS. 10(A) and 10(B) are a view showing a pattern of the layout of a cell array in a conventional semiconductor memory device having the COB structure and a schematic sectional view of the semiconductor memory device. FIG. 10(A) is a view showing a pattern of the layout of a cell array in a semiconductor memory device having the COB structure. FIG. 10(B) is a fragmentary cross sectional view taken along the line D–D' of FIG. 10(A).

Now, descriptions of a twin-cell type semiconductor memory device having the COB structure will be given. This is the same with the semiconductor memory device 101a having the CUB structure.

On a layout pattern for a semiconductor memory device 101b having the COB structure, bit line patterns BLp1, /BLp1, BLp2, and /BLp2 indicated by dotted lines and a plurality of word line patterns WLp are located like a grid and substrate diffusion layer patterns 160p located obliquely to the bit line patterns BLp1, /BLp1, BLp2, and /BLp2, capacitor patterns 161p, and contact plug patterns 162p and 163p are arranged as areas corresponding to memory cells MC shown in FIG. 8. As shown in FIG. 10(B), the semiconductor memory device 101b fabricated by the use of this layout pattern includes diffusion layers 160a and 160b formed in a substrate 164, capacitors 161 formed over bit lines BL1, /BL1, BL2, and /BL2, contact plugs 162 for connecting a diffusion layer 160b and a capacitor 161, and contact plugs 163 for connecting a diffusion layer 160a and the bit line BL1, /BL1, BL2, or /BL2. Because of structural restrictions, each capacitor 161 will be formed at a certain distance (corresponding to the width of one word line, in this example) from the next capacitor 161. Areas E27a and E27b in FIG. 10(A) enclosed with a dashed line pair and form a twin cell. Similarly, areas E28a and E28b in FIG. 10(A) enclosed with a dashed line pair and form a twin cell.

It is assumed that the substrate 164 is a p-type one and that the diffusion layers 160a and 160b which will function as a drain or a source are n-type ones. This is the same with the semiconductor memory device 101a having the CUB structure. Then, for example, an oxide film (not shown) will be formed beneath word lines WL with these word lines WL as gate electrodes. As a result, n-channel MOSFETs will be formed.

Moreover, it is assumed that the minimum fabrication dimension in FIGS. 9 and 10 is F (corresponding to the width of a word line WL and a space between adjacent word lines). Then 1T/1C requires an area of $8F^2$ both in the CUB structure and in the COB structure.

Figure 11A:
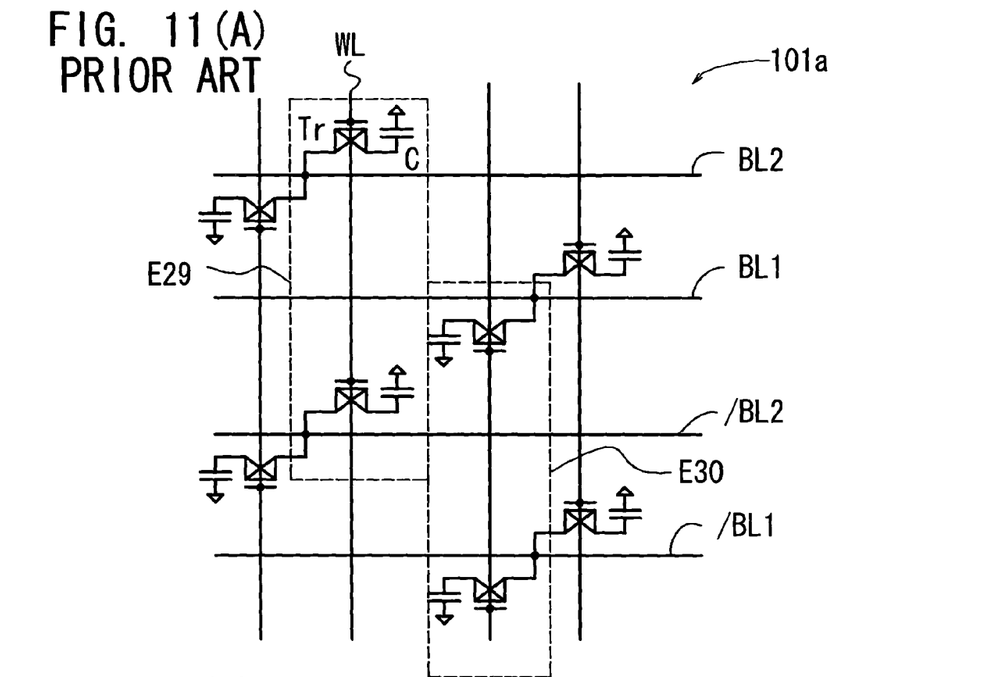
FIGS. 11(A) and 11(B) are circuit diagrams of conventional semiconductor memory devices, FIG. 11(A) being a circuit diagram of a conventional semiconductor memory device having the CUB structure, FIG. 11(B) being a circuit diagram of a conventional semiconductor memory device having the COB structure.
Figure 11B:
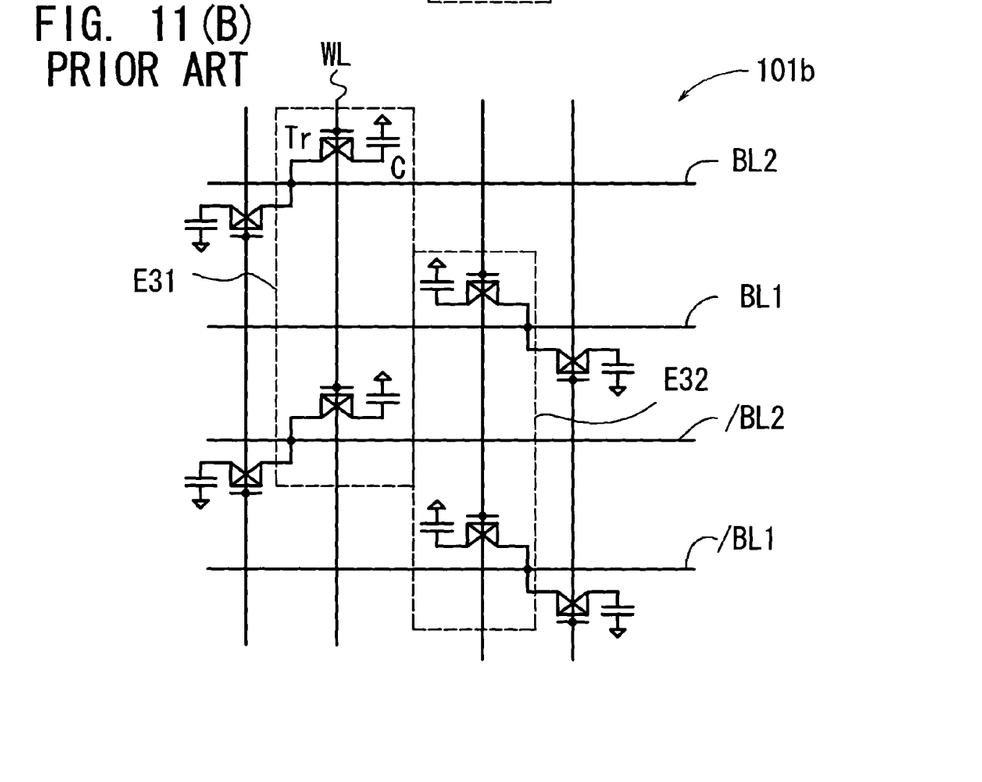

FIGS. 11(A) and 11(B) are circuit diagrams of conventional semiconductor memory devices. FIG. 11(A) is a circuit diagram of a conventional semiconductor memory device having the CUB structure. FIG. 11(B) is a circuit diagram of a conventional semiconductor memory device having the COB structure.

With semiconductor memory devices 101a and 101b, each of memory cells MC shown in FIG. 8 includes a metal oxide semiconductor (MOS) FET (cell transistor) Tr and a cell capacitor C. One input-output terminal (drain or source) of the cell transistor Tr is connected to one of bit lines BL1, /BL1, BL2, and /BL2, the other input-output terminal of the cell transistor Tr is connected to one terminal of the cell capacitor C, and the gate of the cell transistor Tr is connected to a word line WL. The potential of the other terminal of the cell capacitor C is equal to cell plate potential (for example, potential between the L and H levels of power supply potential). Each of areas E29, E30, E31, and E32 enclosed with a dashed line is a twin cell made up of a pair of memory cells MC each having the 1T/1C structure.

When a word line WL is selected and driven, cell transistors Tr the gates of which are connected to the word line WL turn on and the bit line BL1 and /BL1 or the bit lines BL2 and /BL2 and cell capacitors C are electrically connected. As shown in FIG. 8, the bit lines BL1 and /BL1 are connected to the sense amplifier 111 and the bit lines BL2 and /BL2 are connected to the sense amplifier 110. As a result, complementary information is read.

As described above, however, the same cell array that is used in a single-cell type semiconductor memory device is adopted in the conventional twin-cell type semiconductor memory device 101. Therefore, typical cells in single-cell type semiconductor memory devices are $8F^2$ in area, while typical cells in conventional twin-cell type semiconductor memory devices are $16F^2$ in area. That is to say, the area of cell arrays in conventional twin-cell type semiconductor memory devices is substantially twice that of cell arrays in single-cell type semiconductor memory devices. This leads to an increase in the total area of chips in semiconductor memory devices.

In addition, if a layout like the one shown in FIG. 10 is adopted and the word line WL adjacent to the diffusion layer 160b is driven, then electric charges in the capacitor 161 will leak out through the diffusion layer 160b. This is a problem specific to volatile memories, such as DRAMs. Data may be destroyed, especially if a memory cell MC which includes the capacitor 161 is in a standby state and the above word line WL for the next memory cell MC is activated frequently.

SUMMARY OF THE INVENTION

The present invention was made under the background circumstances as described above. An object of the present invention is to provide a twin-cell type semiconductor memory device in which the total area of a chip can be reduced without degrading the performance or while improving it.

In order to achieve the above object, a twin-cell type semiconductor memory device for storing data in a pair of memory cells as complementary information is provided. In this semiconductor memory device, the memory cells are arranged at each word line at intervals at which bit lines are located.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Embodiments of the present invention will now be described with reference to the drawings.

Figure 1:
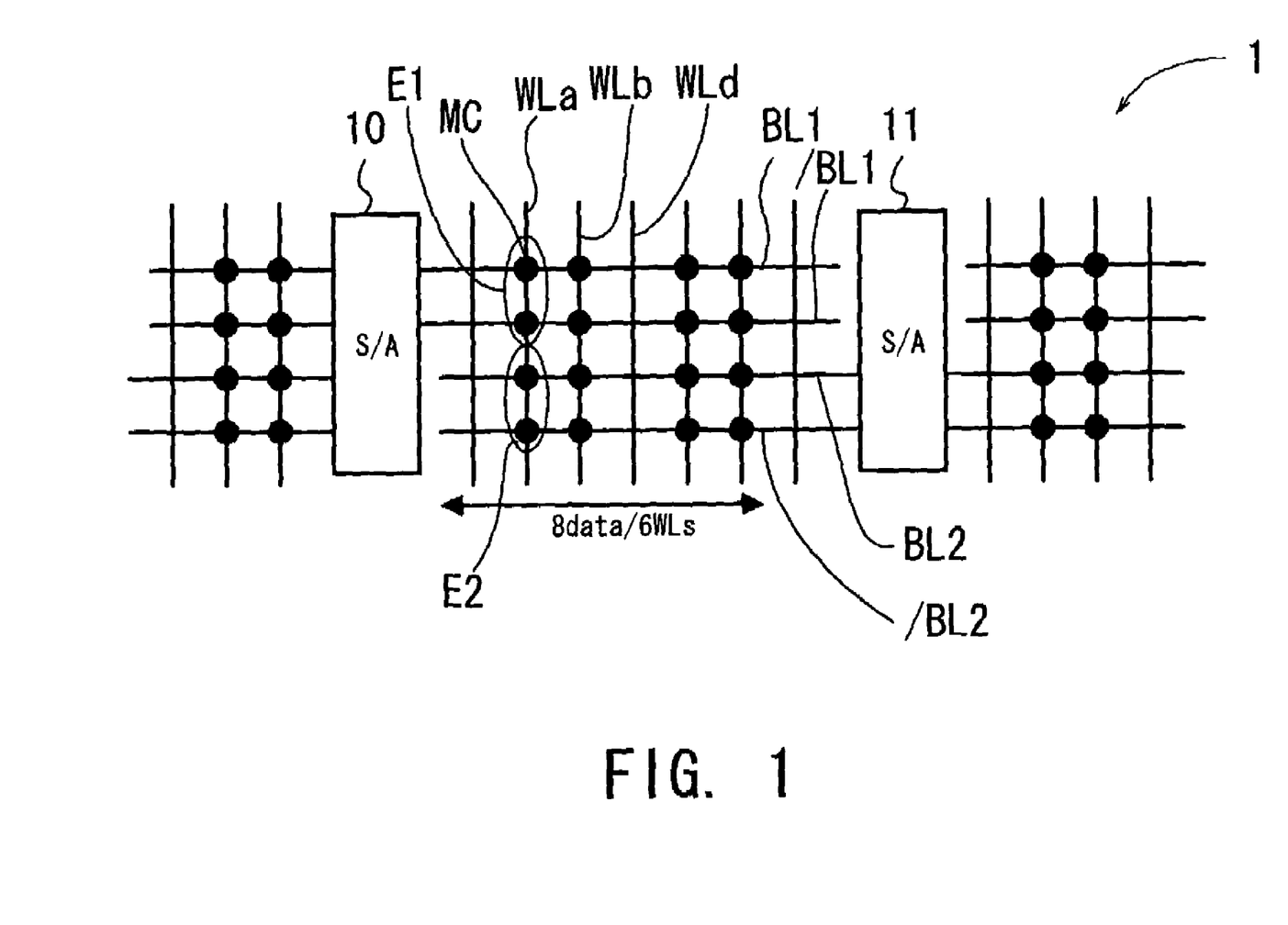
FIG. 1 is a simplified view showing the arrangement of cells in a semiconductor memory device according to a first embodiment of the present invention.

FIG. 1 is a simplified view showing the arrangement of cells in a semiconductor memory device according to a first embodiment of the present invention.

In a semiconductor memory device 1, memory cells MC are arranged at each of word lines WLa and WLb at intervals at which bit lines BL1, /BL1, BL2, and /BL2 are located. The bit lines BL1, /BL1, BL2, and /BL2 are wired by a folded bit line method and are connected to a sense amplifier 10 or 11. Because of restrictions regarding fabrication, one word line (dummy word line) WLd not driven is located for every two word lines WLa and WLb. Descriptions will be given especially with a case where DRAM cells including one transistor and one capacitor, that is to say, having 1T/1C structure are used as memory cells MC as an example.

The semiconductor memory device 1 is a twin-cell type one. Each of areas E1 and E2 corresponds to stored 1-bit complementary information. To read complementary information stored in the area E1, voltage is applied to the word line WLa, a change in the potential of the bit lines BL1 and /BL1 connected to a memory cell MC where complementary data at the H or L level has been written is detected by the sense amplifier 10, and the data is read. To read complementary information stored in the area E2, a change in the potential of the bit lines BL2 and /BL2 connected to a memory cell MC where complementary data has been written is detected by the sense amplifier 11 and the data is read. Accordingly, as shown by an arrow on the right-hand side of FIG. 1, two pieces of data can be stored by two pairs of bit lines in the direction of a word line. As shown by an arrow in the center of FIG. 1, eight pieces of data therefore can be stored in the shown domain by four word lines in the two pairs of bit lines area (two pairs of word lines WLa and WLb) and two dummy word lines WLd, that is to say, by six word lines.

Fixed potential is applied to a dummy word line WLd. This fixed potential preferably is word line reset potential (potential not higher than 0 V) for resetting a word line or any internal power supply potential (power supply potential or potential for raising the potential of a word line).

Now, the layout of a cell array in the semiconductor memory device 1 will be described. There are two kinds of layouts of a cell array: CUB structure in which cell capacitors are formed under bit lines and COB structure in which cell capacitors are formed over bit lines. Both layouts will be described.

Figure 2A:
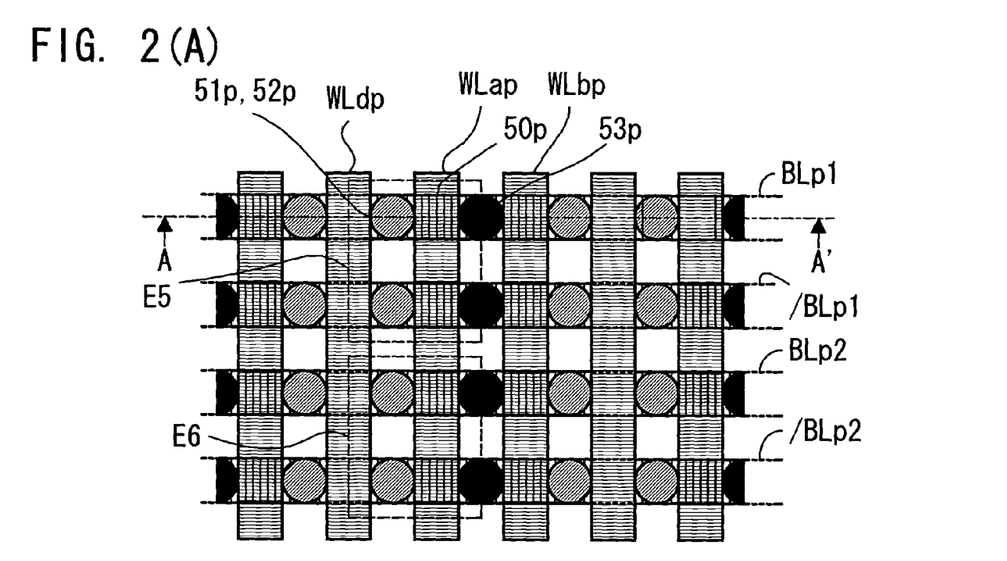
FIGS. 2(A) and 2(B) are a view showing a pattern of the layout of a semiconductor memory device suitable for the CUB structure and a schematic sectional view of the semiconductor memory, FIG. 2(A) being a view showing a pattern of the layout of a semiconductor memory device having the CUB structure, FIG. 2(B) being a fragmentary cross sectional view taken along the line A–A' of FIG. 2(A).
Figure 2B:
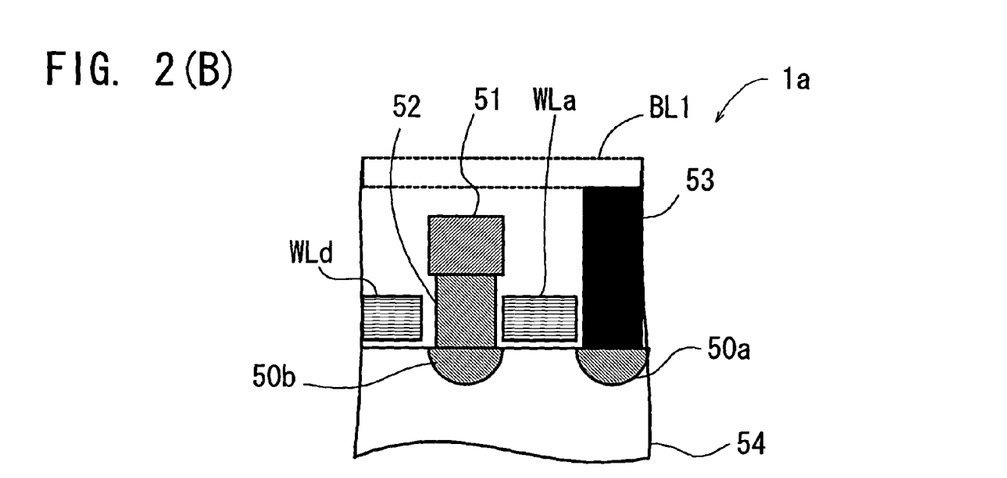

FIGS. 2(A) and 2(B) are a view showing a pattern of the layout of a semiconductor memory device suitable for the CUB structure and a schematic sectional view of the semiconductor memory device. FIG. 2(A) is a view showing a pattern of the layout of a semiconductor memory device having the CUB structure. FIG. 2(B) is a fragmentary cross sectional view taken along the line A–A' of FIG. 2(A).

On a layout pattern for a semiconductor memory device 1*a* having the CUB structure, bit line patterns BLp1, /BLp1, BLp2, and /BLp2 indicated by dotted lines and word line patterns WLap and WLbp and a dummy word line pattern WLdp are located like a grid and substrate diffusion layer patterns 50*p* located in the same direction as the bit line patterns BLp1, /BLp1, BLp2, and /BLp2, capacitor patterns 51*p*, and contact plug patterns 52*p* and 53*p* are arranged as areas corresponding to memory cells MC shown in FIG. 1. As shown in FIG. 2(B), the semiconductor memory device 1*a* fabricated by the use of this layout pattern includes diffusion layers 50*a* and 50*b* formed in a substrate 54, capacitors 51 formed under bit lines BL1, /BL1, BL2, and /BL2, contact plugs 52 for connecting a diffusion layer 50*b* and a cell capacitor 51, and contact plugs 53 for connecting a diffusion layer 50*a* and the bit line BL1, /BL1, BL2, or /BL2. Because of restrictions regarding fabrication, each cell capacitor 51 will be formed at a certain distance (corresponding to the width of one word line, in this example) from a contact plug 53 for connecting a diffusion layer 50*a* and from the next cell capacitor 51.

Each of areas E5 and E6 in FIG. 2(A) enclosed with a dashed line is a twin cell, which includes two memory cells MC and which stores complementary information at the H or L level. In this case, the areas E5 and E6 correspond to, for example, the areas E1 and E2, respectively, in FIG. 1.

The substrate 54 is a p-type one and the diffusion layers 50*a* and 50*b* which will function as a drain or a source are n-type ones. An oxide film (not shown), for example, will be formed beneath the word line WLa with this word line WLa as a gate electrode. As a result, an n-channel MOSFET will be formed.

At least one pair of bit lines BL1 and /BL1 or BL2 and /BL2 connected by the folded bit line method described in FIG. 1 are formed in the same wiring layer.

In the above example, stack capacitors have been used as cell capacitors C to form CUB structure. However, trench capacitors may be used instead.

Figure 3A:
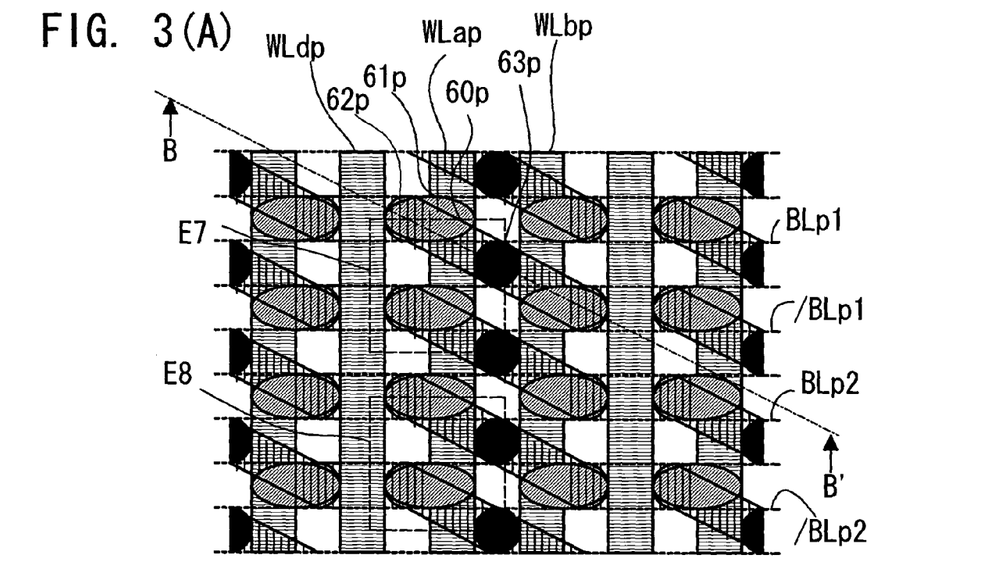
FIGS. 3(A) and 3(B) are a view showing a pattern of the layout of a semiconductor memory device suitable for the COB structure and a schematic sectional view of the semiconductor memory device, FIG. 3(A) being a view showing a pattern of the layout of a semiconductor memory device having the COB structure, FIG. 3(B) being a fragmentary cross sectional view taken along the line B–B' of FIG. 3(A).
Figure 3B:
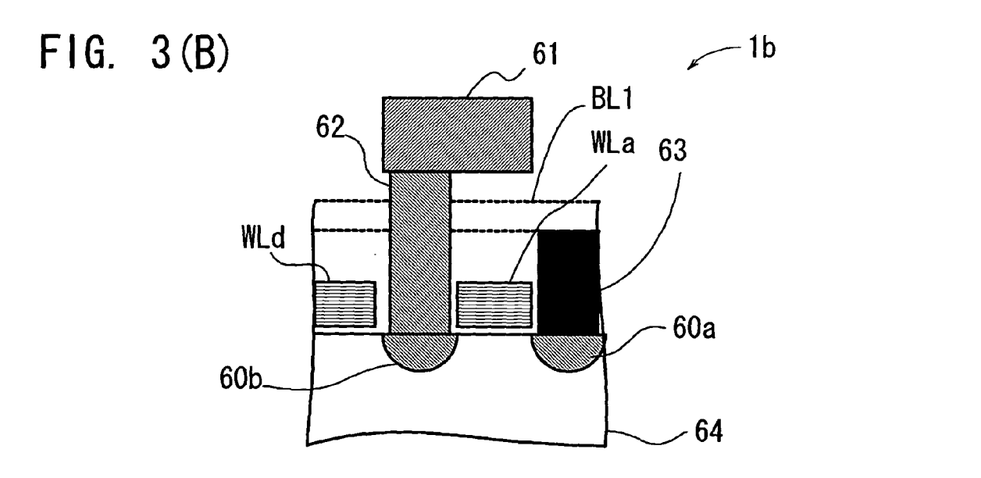

FIGS. 3(A) and 3(B) are a view showing a pattern of the layout of a semiconductor memory device suitable for the COB structure and a schematic sectional view of the semiconductor memory device. FIG. 3(A) is a view showing a pattern of the layout of a semiconductor memory device having the COB structure. FIG. 3(B) is a fragmentary cross sectional view taken along the line B–B' of FIG. 3(A).

On a layout pattern for a semiconductor memory device 1*b* having the COB structure, bit line patterns BLp1, /BLp1, BLp2, and /BLp2 indicated by dotted lines and word line patterns WLap and WLbp and a dummy word line pattern WLdp are located like a grid and substrate diffusion layer patterns 60*p* located obliquely to the bit line patterns BLp1, /BLp1, BLp2, and /BLp2, capacitor patterns 61*p*, and contact plug patterns 62*p* and 63*p* are arranged as areas corresponding to memory cells MC shown in FIG. 1. As shown in FIG. 3(B), the semiconductor memory device 1*b* fabricated by the use of this layout pattern includes diffusion layers 60*a* and 60*b* formed in a substrate 64, cell capacitors 61 formed over bit lines BL1, /BL1, BL2, and /BL2, contact plugs 62 for connecting a diffusion layer 60*b* and a cell capacitor 61, and contact plugs 63 for connecting a diffusion layer 60*a* and the bit line BL1, /BL1, BL2, or /BL2. Because of restrictions regarding fabrication, each cell capacitor 61 will be formed at a certain distance (corresponding to the width of one word line, in this example) from a contact plug 63 for connecting a diffusion layer 60*a* and from the next cell capacitor 61. Each of areas E7 and E8 in FIG. 3(A) enclosed with a dashed line includes two combinations of 1T and 1C and forms a twin cell. In this case, the areas E7 and E8 correspond to, for example, the areas E1 and E2, respectively, in FIG. 1.

FIG. 3(B) shows how the diffusion layers 60*a* and 60*b* which will function as a drain or a source are formed in the substrate 64. This is the same with the semiconductor memory device 1*a* having the CUB structure. As a result, an n-channel MOSFET, for example, will be formed.

As shown in FIGS. 2(A) and 2(B), with the CUB structure the layout in which the contact plugs 53 for connecting a diffusion layer 50*a* and the bit line BL1, /BL1, BL2, or /BL2 and the cell capacitors 51 are arranged at intervals at which the bit lines BL1, /BL1, BL2, and /BL2 are located is adopted. Similarly, as shown in FIGS. 3(A) and 3(B), with the COB structure the layout in which the contact plugs 63 for connecting a diffusion layer 60*a* and the bit line BL1, /BL1, BL2, or /BL2 and the cell capacitors 61 are arranged at intervals at which the bit lines BL1, /BL1, BL2, and /BL2 are located is adopted. As a result, the twin-cell type semiconductor memory device 1, which was described in FIG. 1 and in which memory cells MC are arranged at intervals at which the bit lines are located, can be realized.

Both with the CUB structure and with the COB structure, however, the area of opening portions in a memory may shrink. Therefore, an aspect ratio may be changed to obtain a desired capacitance value or circuit technologies or the like may be used.

Figure 4:
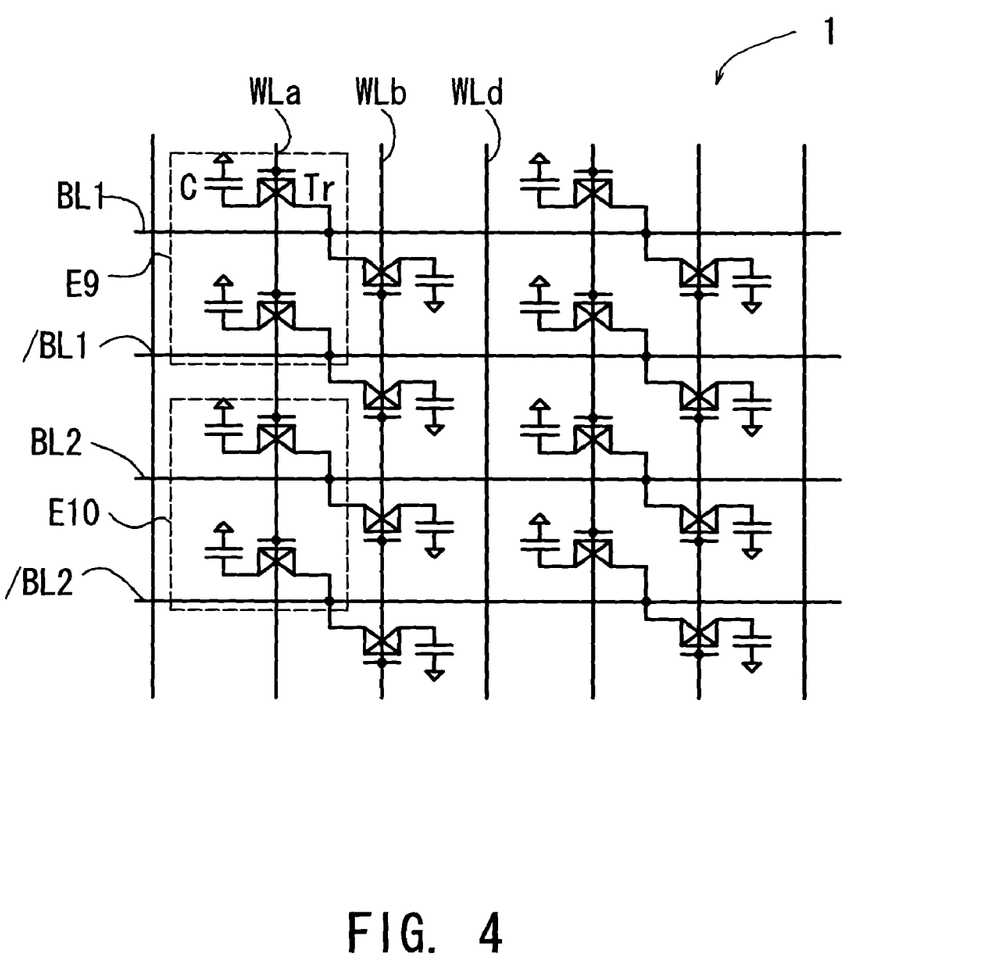
FIG. 4 is a circuit diagram of the semiconductor memory device according to the first embodiment of the present invention.

FIG. 4 is a circuit diagram of the semiconductor memory device according to the first embodiment of the present invention.

This circuit diagram applies both to the CUB structure shown in FIGS. 2(A) and 2(B) and to the COB structure shown in FIGS. 3(A) and 3(B). In the semiconductor memory device 1, the memory cell MC shown in FIG. 1 includes a cell transistor Tr and a cell capacitor C. One input-output terminal (drain or source) of the cell transistor Tr is connected to one of the bit lines BL1, /BL1, BL2, and /BL2, the other input-output terminal of the cell transistor Tr is connected to one terminal of the cell capacitor C, and the gate of the cell transistor Tr is connected to the word line WLa or WLb. The potential of the other terminal of the cell capacitor C is equal to cell plate potential (for example, potential between the L and H levels of power supply potential). The cell transistor Tr is not connected to the dummy word line WLd. Each of areas E9 and E10 in FIG. 4 enclosed with a dashed line includes two memory cells MC (each memory cell MC includes 1T/1C). That is to say, each of the areas E9 and E10 forms a twin cell. The areas E9 and E10 correspond to, for example, the areas E1 and E2, respectively, in FIG. 1.

When the word line WLa is selected and driven, cell transistors Tr the gates of which are connected to the word line WLa turn on and the bit lines BL1, /BL1, BL2, and /BL2 and cell capacitors C are electrically connected. As shown in FIG. 1, the bit lines BL1 and /BL1 are connected to the same sense amplifier 10 and the bit lines BL2 and /BL2 are connected to the same sense amplifier 11. As a result, the sense amplifier 10 and 11 read complementary information.

Conventionally, as shown in FIG. 8(B), eight word lines WL have been needed to hold eight pieces of data with two pairs of bit lines. With the semiconductor memory device 1 according to the first embodiment of the present invention, however, eight pieces of data can be held by two word lines WLa, two word lines WLb, and two word lines WLd, that is to say, by six word lines in total. In other words, the area of a chip in the direction of bit lines can be reduced by a quarter compared with the conventional twin-cell type semiconductor memory device 101.

By fixing a dummy word line WLd at word line reset potential or any internal power supply potential, coupling noise between word lines, leakage from a field-effect transistor, etc. can be restrained. In addition, by doing so, capacitance between a word line WLd and a substrate can be used for stabilizing power supply, resulting in noise restraint.

Moreover, assuming that the number of pairs of bit lines used is the same, the number of pieces of data which can be accessed by driving one word line in the semiconductor memory device 1 according to the first embodiment of the present invention shown in FIG. 1 will double compared with the conventional semiconductor memory device 101 shown in FIG. 8. This means that the number of pieces of data which can be accessed by driving a word line with the same length as a word line in the conventional semiconductor memory device 101 has will double. In other words, the length of a word line to be driven for accessing a certain number of pieces of data will be halved compared with the conventional semiconductor memory device 101. Therefore, in case of a hierarchical word line scheme, the number of subword decoders (not shown) can be halved. This reduces the total area of a chip.

In addition, by locating one dummy word line WLd for every two word lines WLa and WLb, metal wirings for shunting WLa and WLb can be formed at an interval one and a half times the interval between word lines WLa and WLb.

Figure 5A:
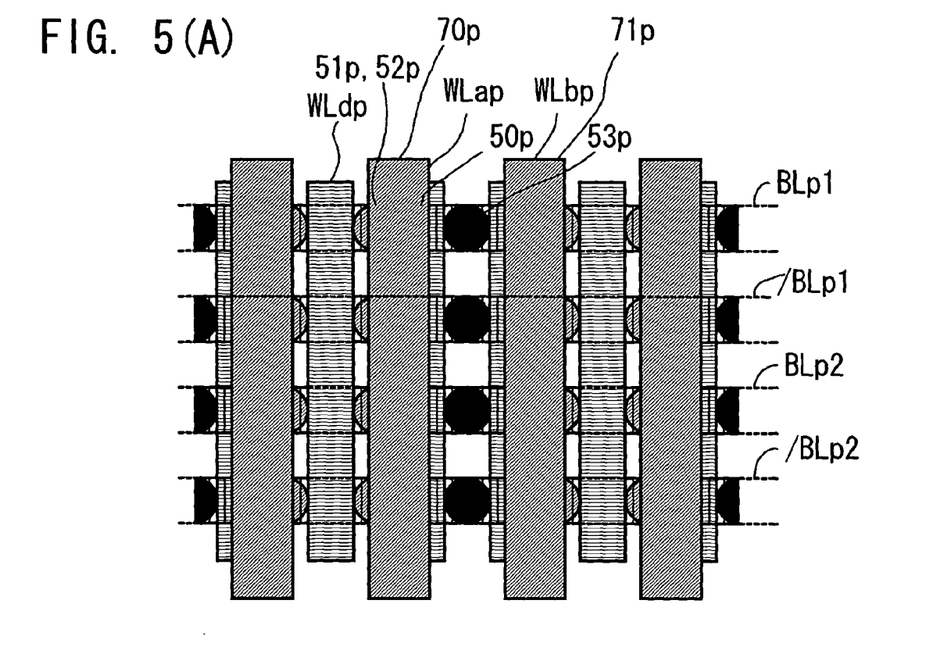
FIGS. 5(A) and 5(B) are views for describing the metal wirings for shunting of word lines to reduce RC delay of word lines, FIG. 5(A) being a view showing a layout pattern on which metal wirings for shunting a word line in a semiconductor memory device having the CUB structure are located, FIG. 5(B) being a view showing a layout pattern on which metal wirings for shunitng a word line in a semiconductor memory device having the COB structure are located.
Figure 5B:
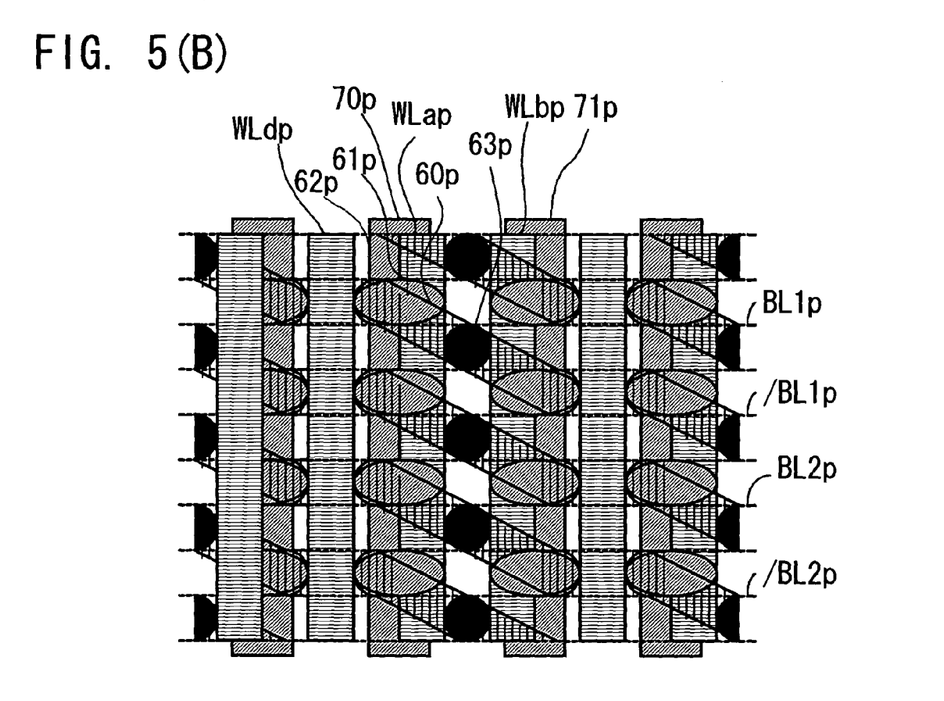

FIGS. 5(A) and 5(B) are views for describing the shunting of word lines. FIG. 5(A) is a view showing a layout pattern on which metal wirings for shunting word lines in a semiconductor memory device having the CUB structure are located. FIG. 5(B) is a view showing a layout pattern on which metal wirings for shunting word lines in a semiconductor memory device having the COB structure are located.

In FIG. 5(A), metal wiring patterns 70p and 71p for lining a word line are located above word line patterns WLap and WLbp which connect with cell transistors Tr on the layout pattern for the semiconductor memory device 1a according to the first embodiment of the present invention shown in FIG. 2(A). Similarly, in FIG. 5(B), metal wiring patterns 70p and 71p for shunting word lines are located above word line patterns WLap and WLbp which connect with cell transistors Tr on the layout pattern for the semiconductor memory device 1b according to the first embodiment of the present invention shown in FIG. 3(A).

An interval between the word line patterns WLp for the conventional semiconductor memory device 101a shown in FIG. 9(B) or the conventional semiconductor memory device 101b shown in FIG. 10(B) is too narrow. Moreover, it is difficult to process a metal material. Therefore, it is difficult to line a word line with a metal wiring formed by the metal wiring pattern 70p or 71p. With the semiconductor memory device 1a or 1b according to the first embodiment of the present invention, however, there is one dummy word line pattern WLdp for every two word line patterns WLap and WLbp, so an average line and space between word line patterns is wider than conventional ones. As a result, the metal wiring patterns 70p and 71p should be formed at an interval one and a half times of the interval between the word line patterns WLap and WLbp. This enables the shunting of a word line by a metal wiring. As a result, there is no need to adopt a hierarchical word lines scheme as means for reducing resistance of word lines and the area of a chip will be reduced.

Now, a second embodiment of the present invention will be described.

Figure 6A:
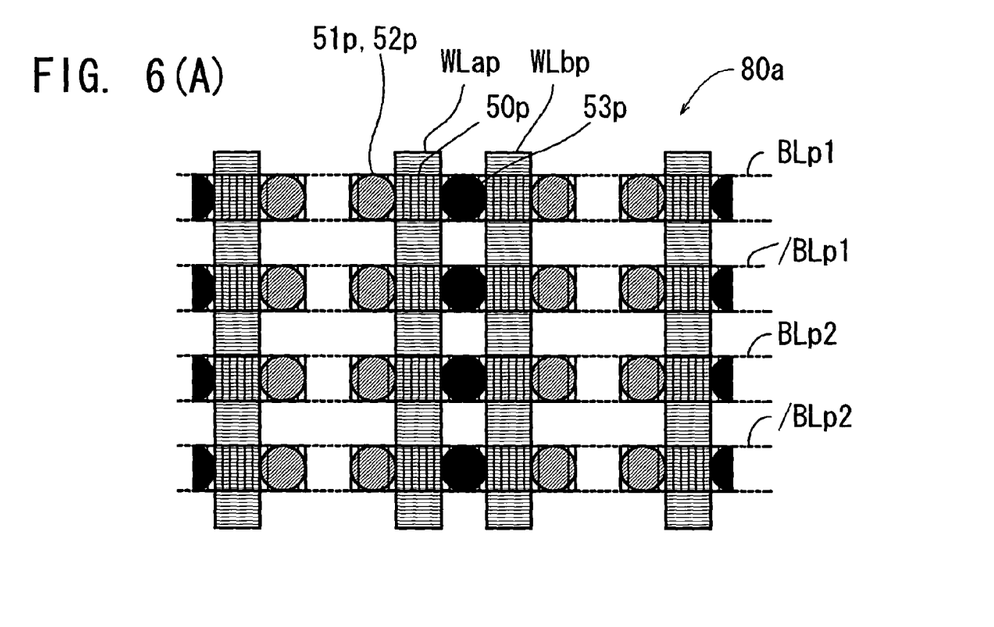
FIGS. 6(A) and 6(B) are views showing a pattern of the layout of a semiconductor memory device according to a second embodiment of the present invention, FIG. 6(A) being a view showing a pattern of the layout of a semiconductor memory device having the CUB structure, FIG. 6(B) being a view showing a pattern of the layout of a semiconductor memory device having the COB structure.
Figure 6B:
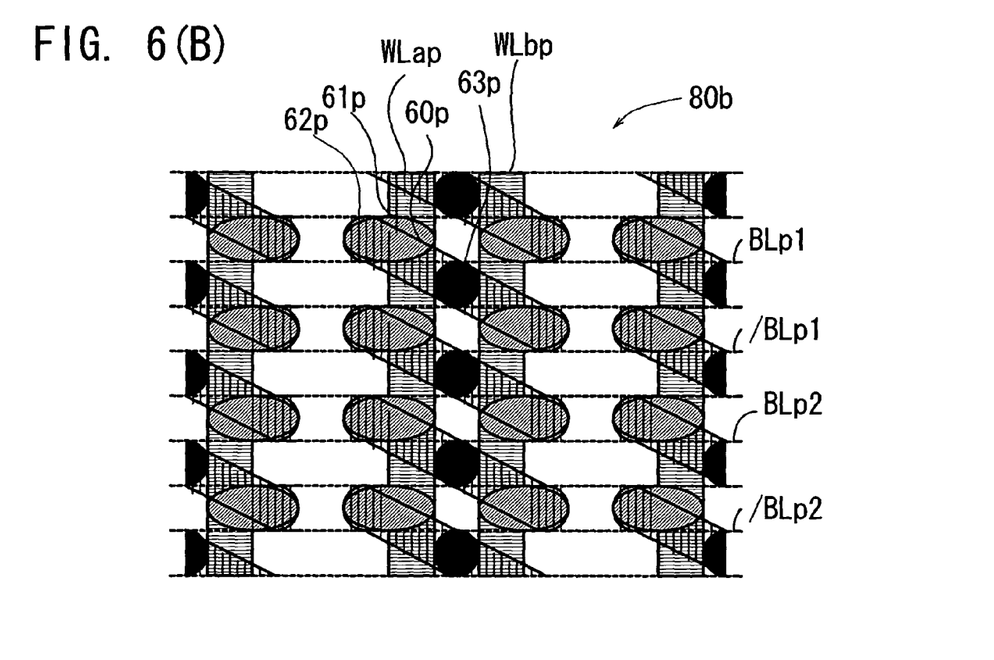

FIGS. 6(A) and 6(B) are views showing a pattern of the layout of a semiconductor memory device according to a second embodiment of the present invention. FIG. 6(A) is a view showing a pattern of the layout of a semiconductor memory device having the CUB structure. FIG. 6(B) is a view showing a pattern of the layout of a semiconductor memory device having the COB structure.

Cross sectional views of semiconductor memory devices 80a and 80b according to the second embodiment of the present invention corresponding to the layout patterns are almost the same as those of the semiconductor memory devices 1a and 1b, respectively, according to the first embodiment of the present invention, so they will be omitted.

FIG. 6(A) corresponds to FIG. 2(A) which shows the layout pattern for the semiconductor memory device 1a according to the first embodiment of the present invention. FIG. 6(B) corresponds to FIG. 3(A) which shows the layout pattern for the semiconductor memory device 1b according to the first embodiment of the present invention. The same components are denoted by the same symbols and descriptions of them will be omitted.

The semiconductor memory devices 80a and 80b according to the second embodiment of the present invention differ from the semiconductor memory devices 1a and 1b, respectively, according to the first embodiment of the present invention only in the dummy word line patterns WLdp being eliminated. However, because of restrictions regarding fabrication, certain spaces (corresponding to the width of one word line, in this example) are provided.

The semiconductor memory devices 80a and 80b operate and function the same as the semiconductor memory devices 1a and 1b, respectively, according to the first embodiment of the present invention. For example, which of the semiconductor memory devices 80a and 1a should be selected will depend on easiness of forming elements or contact holes in the process of fabrication.

Figure 7:
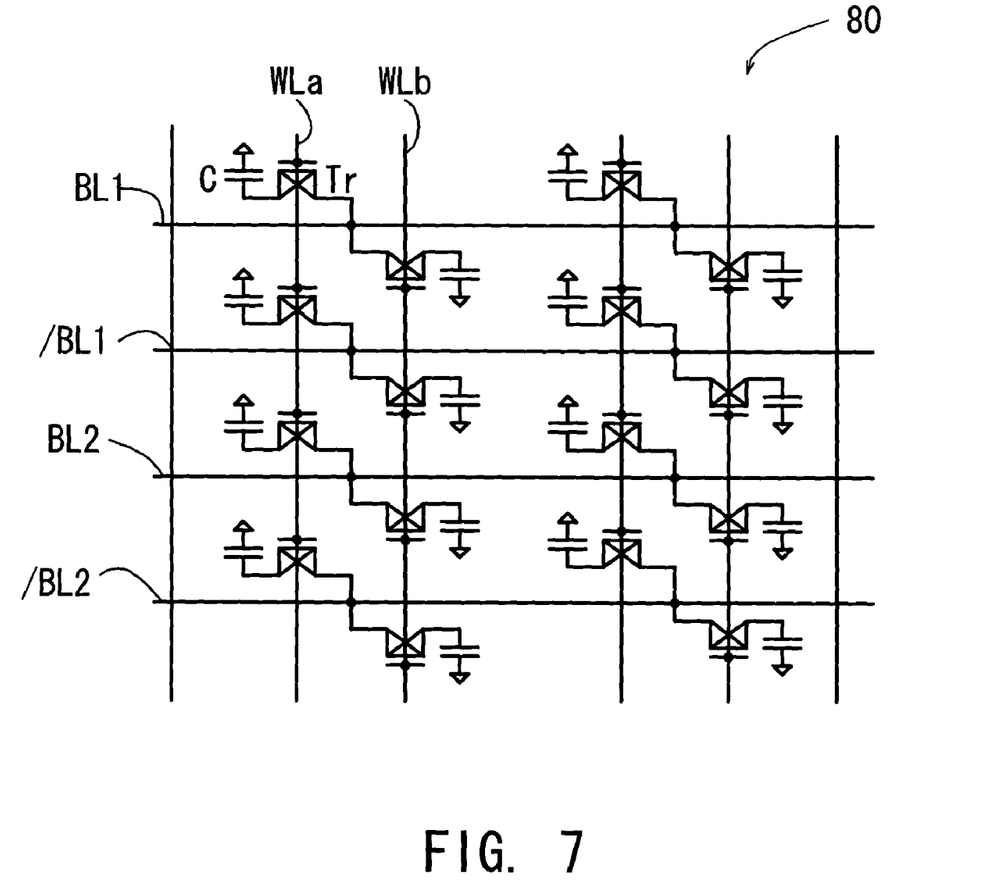
FIG. 7 is a circuit diagram of the semiconductor memory device according to the second embodiment of the present invention.

FIG. 7 is a circuit diagram of the semiconductor memory device according to the second embodiment of the present invention.

A circuit diagram of a semiconductor memory device 80 according to the second embodiment of the present invention differs from the circuit diagram of the semiconductor memory device 1 according to the first embodiment of the present invention shown in FIG. 4 only in the dummy word lines WLd not being located.

With the semiconductor memory device 80 according to the second embodiment of the present invention, word lines WLa and WLb can also be shunted by metal wirings.

The above description has been given with a case where DRAMs having the 1T/1C structure are used as memory cells MC as an example. However, devices of another kind, such as ferroelectric random access memories (FeRAMs) or magnetic random access memories (MRAMs), in which data is stored by making use of complementary cells may be used as memory cells MC.

In addition, the present invention is not limited to the above embodiments. There are various fabrication methods and design rules, so other embodiments are also possible.

As has been described in the foregoing, in the present invention memory cells are arranged at each word line at intervals at which bit lines are located. As a result, efficiency in the area of a chip can be improved compared with conventional chips. Therefore, the area of a chip in a twin-cell type semiconductor memory device can be reduced. Furthermore, not only a reduction in the size of an array but also the improvement of operating speed or reliability can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A twin-cell type semiconductor memory device for storing data in a pair of memory cells as complementary information, wherein the memory cells are arranged at each of word lines at intervals at which bit lines are located,
   wherein one word line not driven is located for every two word lines.

2. The semiconductor memory device according to claim 1, wherein each of the memory cells includes one transistor and one storage element.

3. The semiconductor memory device according to claim 1, wherein the bit lines are arranged as a folded bit line.

4. The semiconductor memory device according to claim 3, wherein the pair of bit lines arranged as the folded bit line are formed in the same wiring layer.

5. The semiconductor memory device according to claim 1, wherein contacts for connecting the bit lines and diffusion layers are arranged along the word lines at the intervals at which the bit lines are located.

6. The semiconductor memory device according to claim 1, wherein fixed potential is applied to the word line not driven.

7. The semiconductor memory device according to claim 6, wherein the fixed potential is word line reset potential for resetting the word line.

8. The semiconductor memory device according to claim 6, wherein the fixed potential is power supply potential used in an integrated circuit.

9. The semiconductor memory device according to claim 1, wherein COB structure is formed.

10. The semiconductor memory device according to claim 1, wherein CUB structure is formed.

* * * * *